United States Patent
Kloeckner et al.

(10) Patent No.: US 8,250,742 B2
(45) Date of Patent: Aug. 28, 2012

(54) DIE EJECTOR

(75) Inventors: Daniel Kloeckner, Lucerne (CH); Ives Muehlemann, Cham (CH); Daniel Schnetzler, Unterägeri (CH)

(73) Assignee: ESEC AG, Cham (CH)

( * ) Notice: Subject to any disclaimer, the term of this patent is extended or adjusted under 35 U.S.C. 154(b) by 435 days.

(21) Appl. No.: 12/611,758

(22) Filed: Nov. 3, 2009

(65) Prior Publication Data
US 2010/0107405 A1    May 6, 2010

(30) Foreign Application Priority Data

Nov. 5, 2008  (CH) ........................................ 1748/08
Sep. 18, 2009  (CH) ........................................ 1452/09

(51) Int. Cl.
*B23P 19/00*        (2006.01)
(52) U.S. Cl. ................. 29/762; 29/739; 29/740; 29/743
(58) Field of Classification Search .................... 29/762, 29/417, 426.1, 426.3, 739, 740, 743; 438/118, 438/232
See application file for complete search history.

(56) References Cited

U.S. PATENT DOCUMENTS

| | | | |
|---|---|---|---|
| 4,921,564 A | 5/1990 | Moore | |
| 6,386,815 B1 | 5/2002 | Tawara | |
| 6,555,418 B2 * | 4/2003 | Kurosawa et al. | ............ 438/118 |
| 6,561,743 B1 | 5/2003 | Nakatsu | |
| 7,238,593 B2 | 7/2007 | Medding et al. | |
| 7,265,035 B2 | 9/2007 | Honma et al. | |
| 2002/0129899 A1 | 9/2002 | Mimata et al. | |
| 2003/0154597 A1 * | 8/2003 | Yee et al. | ........................ 29/832 |
| 2004/0105750 A1 | 6/2004 | Bolliger et al. | |
| 2005/0059205 A1 | 3/2005 | Maki et al. | |
| 2008/0086874 A1 | 4/2008 | Cheung et al. | |

FOREIGN PATENT DOCUMENTS

| | | |
|---|---|---|
| JP | 2008-192736 | 8/2008 |
| WO | 2005/117072 | 12/2005 |

OTHER PUBLICATIONS

Search Report for European Patent Application No. 09 17 3469, dated Jan. 26, 2010.

* cited by examiner

*Primary Examiner* — Thiem Phan
(74) *Attorney, Agent, or Firm* — Nixon Peabody LLP

(57) ABSTRACT

A die ejector comprises a chamber which can be subjected to vacuum and comprises a cover plate having a hole, a plurality of plates which are arranged in the interior of the chamber, protrude into the first hole and are jointly and also individually displaceable in a direction extending perpendicularly or in an oblique way in relation to the surface of the cover plate, and drive means in order to displace the plates. The drive means comprise a drive mechanism which comprises a motor and a pin which can be moved along a predetermined path and which is movable by the motor between two positions back and forth. Each of the plates comprises a path-like opening. The path-like opening is different from plate to plate in such a way that the plates are displaced in a predetermined sequence in the mentioned direction when the pin is moved along the path.

4 Claims, 4 Drawing Sheets

DIE EJECTOR

PRIORITY CLAIM

Applicant hereby claims foreign priority under 35 U.S.C. §119 from Swiss Application No. 1748/08 filed Nov. 5, 2008 and Swiss Application No. 1452/09 filed Sep. 18, 2009, the disclosures of which are herein incorporated by reference.

FIELD OF THE INVENTION

The invention relates to a die ejector which is used in mounting semiconductor chips in order to support the detachment and removal of a semiconductor chip from a foil.

BACKGROUND OF THE INVENTION

The semiconductor chips are typically provided on a foil held in a frame, which is also known as a tape in the field, for the purpose of processing on a semiconductor mounting device. The semiconductor chips adhere to the foil. The frame with the foil is received by a displaceable wafer table. The wafer table is displaced in cycles in order to provide one semiconductor chip after the other at a location and the semiconductor chip which is then provided is received by a chip gripper and placed on a substrate. The removal of the provided semiconductor chip from the foil is supported by a die ejector which is arranged beneath the foil.

In many cases, one or several needles arranged in the die ejector will support the detachment of the semiconductor chip from the foil. Needle-supported methods are known from a large number of patents, e.g. from US 20040105750 or U.S. Pat. No. 7,265,035. In US 2008086874, the die ejector comprises a block with a plurality of rods which have a flat end and a second block with a plurality of needles, with the needles being arranged between the rods and the surface of the flat end of each rod having a multiple of the cross section of a needle. For the purpose of detaching the semiconductor chip, the block with the rods is lifted at first and the block with the needles is lifted until the needles protrude beyond the rods.

A die ejector with supporting structures is known from WO 2005117072, on which the foil rests during the entire detachment process. The supporting structures are enclosed by rods with a flat end which are displaceable in the direction towards the semiconductor chip as well as in the opposite direction. The supporting structures and the rods can also be formed by a plurality of individual tappet rods which are arranged in the manner of a matrix.

A die ejector is known from US 20050059205 which comprises several plates which are disposed adjacent to one another, and for the purpose of detaching the semiconductor chips are lifted either jointly and then lowered sequentially from the outside to the inside or are lifted from the outside to the inside sequentially in order to form a pyramidal elevation that protrudes beyond the supporting plane.

Various methods are also known in which the semiconductor chip is detached from the foil without the use of a needle. In U.S. Pat. No. 4,921,564, the foil beneath the semiconductor chip is subjected to a vacuum at many individual locations in order to remove the foil at these places from the semiconductor chip. In US 2002129899 and U.S. Pat. No. 7,238,593, the foil is drawn over the edge of the die ejector and removed thereby. In U.S. Pat. No. 6,561,743, the foil is drawn off in a boundary region of the semiconductor chip by means of vacuum and then displaced relative to the semiconductor chip which is gripped by the chip gripper, with the semiconductor chip being detached from the foil.

The thickness of the semiconductor chips to be detached decreases continually. Currently, the thickness is in many cases less than 100 micrometers, with a tendency towards further reduced thicknesses of 20 to 10 or even 5 micrometers. An additional factor is that the wafers are sometimes provided with an adhesive layer on their reverse side. The adherence of the semiconductor chips on the foil will thus increase. The technologies as described above are often no longer sufficient and/or are not reliable enough or are relative slow, which means that it often happens that a semiconductor chip is damaged or destroyed during detachment.

SUMMARY OF THE INVENTION

The invention is based on the object of developing a die ejector which enables a rapid, reliable and damage-free detachment of the semiconductor chips, especially thin semiconductor chips, from the foil.

A die ejector in accordance with the invention comprises a chamber which can be subjected to vacuum and comprises a cover plate having a hole, and a plurality of plates which are arranged in the interior of the chamber, protrude into the first hole and are displaceable in a direction which extends perpendicular or oblique in relation to the surface of the cover plate. The die ejector further comprises drive means in order to displace the plates. The drive means comprise at least one drive mechanism which has a motor and a pin that is movable along a predetermined path and is movable back and forth between two positions by the motor. Each of the plates comprises a path-like opening. The pin is guided through the path-like opening of each of the plates, with the path-like opening differing from plate to plate in such a way that the plates are displaced in a predetermined sequence in the mentioned direction when the pin is moved along the path.

The drive means advantageously comprise a further drive mechanism with which the plates are jointly displaceable in the mentioned direction.

The plates are preferably made of two parts, namely a first part which comprises the path-like opening and a second part which can be inserted on the first part. The first parts of all plates are arranged in the mentioned chamber and coupled with the drive mechanism. This enables a simple adjustment of the die ejector to semiconductor chips of different sizes. The first parts of all plates could thus also be regarded as a component of the drive mechanism, while the second parts of the plates which are inserted for a specific application and whose number can be lower than the number of the first parts could be regarded as the actual plates.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

DETAILED DESCRIPTION OF THE INVENTION

Figure 1:
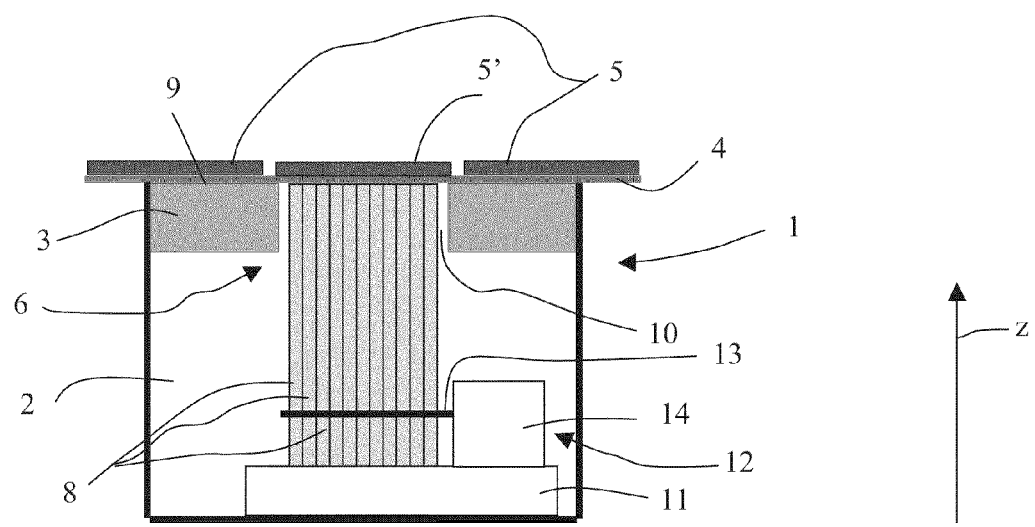
FIG. 1 shows a side and cross-sectional view of a die ejector in accordance with the invention.

FIG. 1 shows a side view and cross-sectional view of a die ejector 1 in accordance with the invention. The die ejector 1 comprises an enclosed chamber 2 which can be subjected to vacuum and comprises a preferably removable and exchangeable cover plate 3 on which rests a portion of the foil 4 with the semiconductor chips 5. The chamber 2 can also be formed by the housing of the die ejector 1 or a part thereof. The cover plate 3 can also be a cover. The cover plate 3 comprises a rectangular hole 6 in the middle which has approximately the same size as the semiconductor chips 5 and preferably a plurality of further holes 7 which are only shown in FIG. 2 and are used to draw in the foil 4 when the chamber 2 is subjected to vacuum. The die ejector 1 further comprises a plurality of plates 8 which are arranged in the interior of chamber 2 adjacent to one another and are displaceable jointly and/or individually in a direction designated as z-direction. As in the example, the z-direction extends preferably perpendicularly to the surface 9 of the cover plate 3 or at least under an angle oblique in relation to the surface 9 of the cover plate 3, with the angle designating the angle which the z-direction encloses with the vertical line relative to the surface 9 of the cover plate 3. The angle can lie in a large range of 0 to 80° and is usually only limited by the available space. The angle is clearly different from 90° however because the scope of the invention is left when the plates 8 are displaced parallel to the surface 9 of the cover plate 3. The plates 8 protrude into the central hole 6 of the cover plate 3 and advantageously rest on one another. A circumferential gap 10 exists between the plates 8 and the edge of hole 6. Chamber 2 can be subjected to vacuum. The surface area covered by the plates 8 within the hole 6 of the cover plate 3 of the die ejector 1 (FIG. 1) is preferably slightly smaller than the surface area of a semiconductor chip 5, namely dimensioned in such a way that the semiconductor chip 5 protrudes beyond the surface assumed by the plates 8 on all sides in lateral direction by approx. 0.5 to 1 millimeter. The number of plates 8 depends on the dimensions of the semiconductor chip 5. It is at least three, namely for very small semiconductor chips of 3*3 millimeters.

The term plates shall be understood as being all objects which can exert the same function. Plates 8 can also be rods or beams for example. The plates, rods, beams, etc. can rest on each other or, if there is enough space, can also be arranged to be spaced from one another.

The die ejector 1 further comprises drive means in order to displace the plates 8 jointly and also individually in the z-direction. As is shown in the example, such drive means preferably comprise a first drive mechanism 11 and a second drive mechanism 12. The first drive mechanism 11 is used to displace all plates 8 jointly and, in this example, also the second drive mechanism 12 in the z-direction. The second drive mechanism 12 is used to displace the plates 8 individually in a predetermined sequence in the z-direction. The second drive mechanism 12, which is based on the principle of the cam disk, is made in such a way that the plates 8 are displaced in the z-direction by restricted guidance. This solution offers the advantage that no springs are required.

Figure 2:
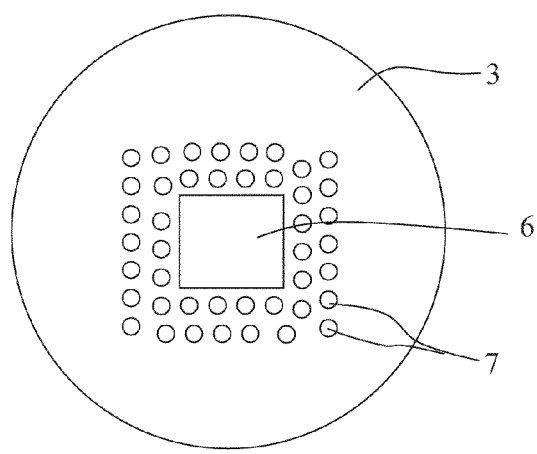
FIG. 2 shows the die ejector in a top view.

FIG. 2 shows the cover plate 3 of the chamber 2 of the die ejector 1 in a top view.

Figure 3:
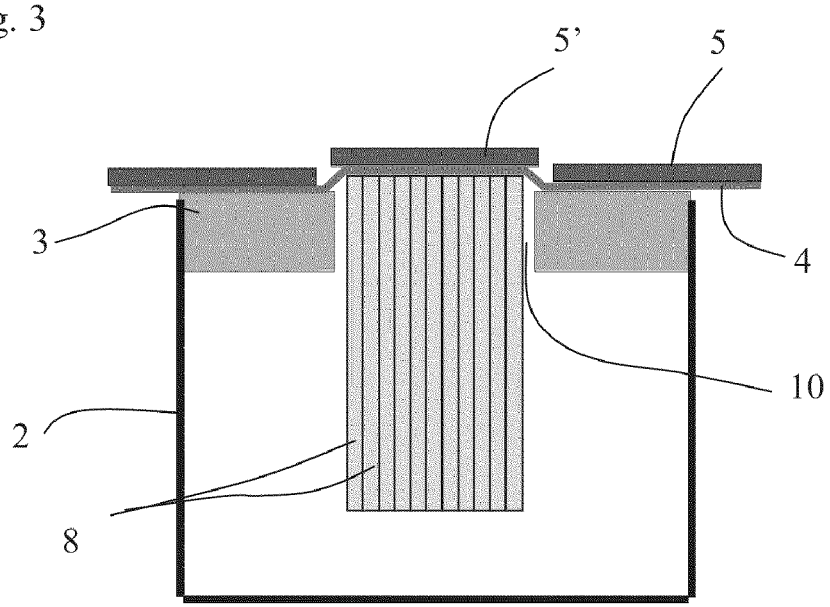
FIGS. 3 to 6 show snapshots during the detachment and removal of a semiconductor chip from a foil.
Figure 4:
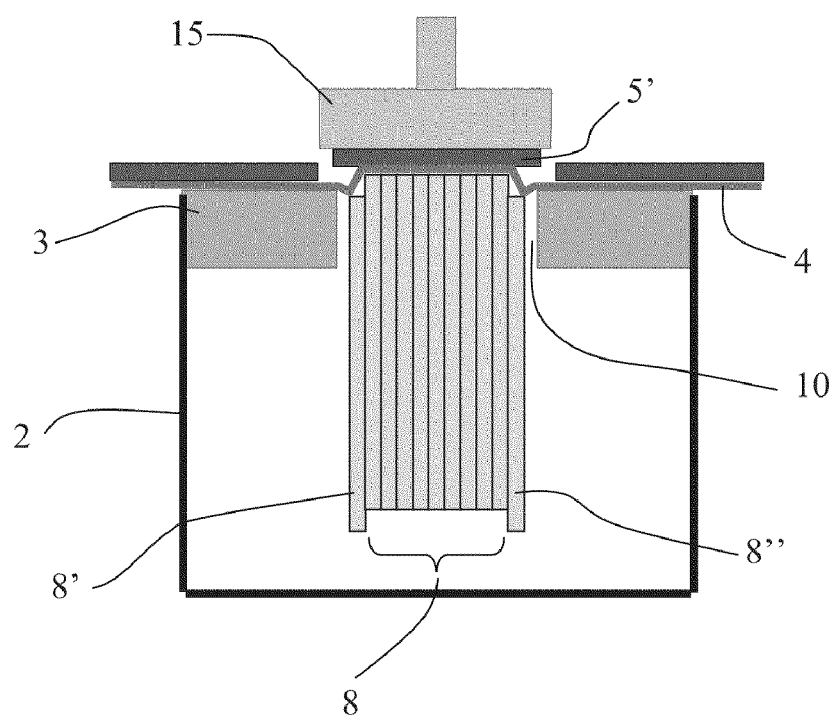

The detachment and removal of a semiconductor chip 5 from the foil 4 occurs by means of the die ejector 1 in cooperation with a chip gripper 15 (FIG. 4). Chip gripper 15 advantageously contains a suction member which can be subjected to vacuum and which draws in the semiconductor chip and holds it tightly. The chip gripper 15 can also contain a suction member which is based on the Bernoulli effect and which needs to be supplied with compressed air in order to achieve the suction effect. The method for detaching a semiconductor chip will now be explained in detail by reference to FIG. 1 and FIGS. 3 to 6, with each of these drawings representing a snapshot. The drive means for moving the plates 8 are not shown in FIGS. 3 to 6. The movement of the plates 8 in the positive z-direction is designated as lifting and a movement of the plates 8 in negative z-direction is designated as lowering. The sides of the plates 8 which face the foil 4 are approximately flush with the surface 9 of the cover plate 3 at the beginning Some of the plates 8 are designated especially as plates 8', 8" and 8'".

The method comprises the following steps A through D:

A) displacing the foil 4 relative to the die ejector 1 in such a way that the semiconductor chip 5' to be detached is disposed above the hole 6 of the cover plate 3;

B) subjecting chamber 2 to vacuum, through which the foil 4 is drawn to the cover plate 3;

C) lowering of individual or all of the plates 8 successively in a predetermined sequence, and D) moving away the chip gripper 15 with the semiconductor chip 5', with the chip gripper 15 being lowered and drawing in the semiconductor chip 5' and holding the same tightly after step A or after step B or after step C.

It is advantageous in many cases to perform the following step between the step B and the step C:

BC) Joint lifting of the plates 8 by a predetermined distance which is chosen in such a way that the sides of the plates 8 facing the foil 4 protrude beyond the surface 9 of the cover plate 3.

The lowering of the plates 8 in step C preferably begins either with one of the two outermost plates 8', 8", namely the outermost left plate 8' or the outermost right plate 8", or the two outermost plates 8' and 8" simultaneously. The lowering of the plates 8 can also begin with any arbitrary other plate. The plates 8 are lowered by a second predetermined distance. If step BC is performed, the second predetermined distance is larger than the first predetermined distance.

Figure 5:
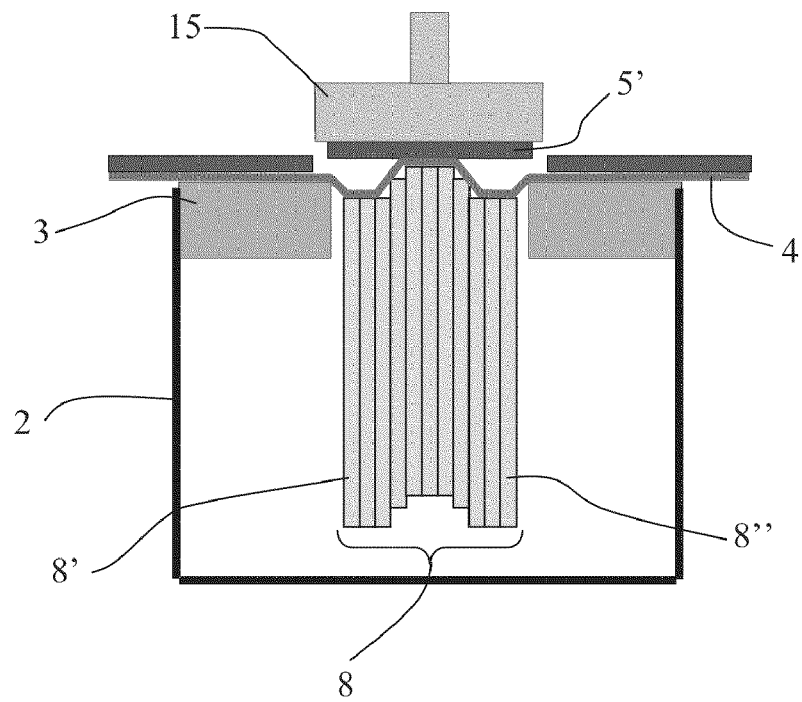
Figure 6:
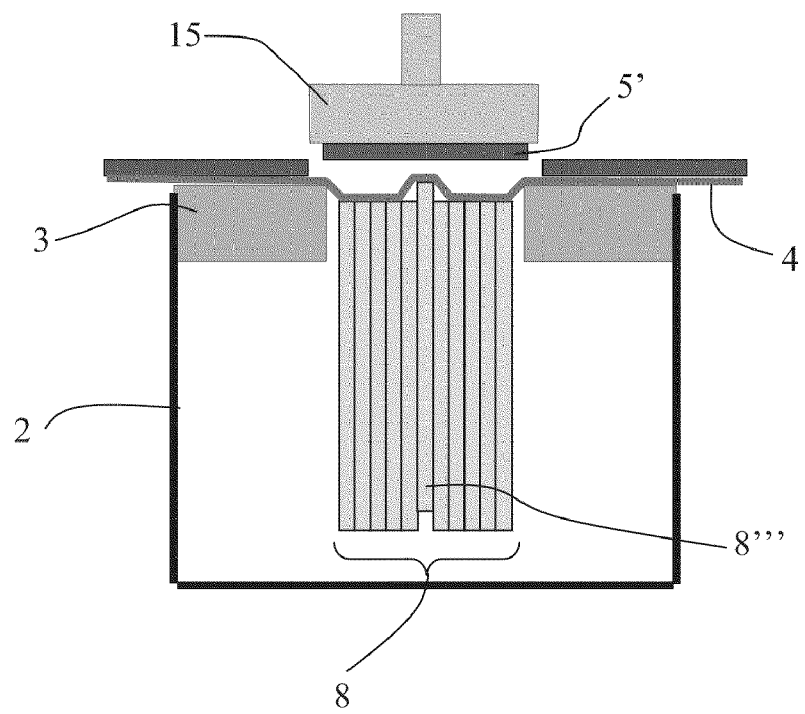

FIG. 1 shows a snapshot after step A. FIG. 3 shows a snapshot after step BC. FIG. 4 shows a snapshot at the time at which the two outermost plates 8' and 8" are completely lowered and the plates adjacent to the outermost plates 8' and 8" are partly lowered. The foil 4 has detached from the edge of the semiconductor chip 5. FIG. 5 shows a snapshot at the time at which already several of the plates 8 have been lowered completely. The detachment of the foil 4 from the semiconductor chip 5 has progressed even further. FIG. 6 shows a snapshot at the time at which all plates 8 have been lowered completely in the middle, with the exception of a single plate 8'. Plate 8' has already been lowered partly and the foil 4 has been detached completely from the semiconductor chip 5. The vacuum prevailing in gap 10 exerts a suction force on the bottom side of the foil 4 and draws the foil 4 towards the cover plate 3 of the die ejector 1, so that the foil 4 detaches increasingly from the semiconductor chip 5 during the method step BC, if it is performed, and during the method step C, and is finished at the latest with the method step D.

The time from which the support of the chip gripper 15 is required for detaching the foil 4 from the semiconductor chip 5 depends on several factors such as the thickness of the semiconductor chip 5, the size of the semiconductor chip 5, the holding force of the foil 4, the suction force exerted by the vacuum on the foil 4. The later the chip gripper 15 needs to be used, the larger the throughput of the automatic assembly machine.

In order to prepare the removal of the next semiconductor chip 5, the plates 8 are brought to the initial position according to FIG. 1.

The drive means of the die ejector 1 are chosen in accordance with the invention in such a way that the method step C or the method steps BC and C can be performed within a very short period of typically less than 100 ms. This is possible when the plates 8 are forcibly guided. The preferred embodiment of the drive means with two drive mechanisms enables the optimization of the speed of the two method steps BC and C individually.

Figure 7:
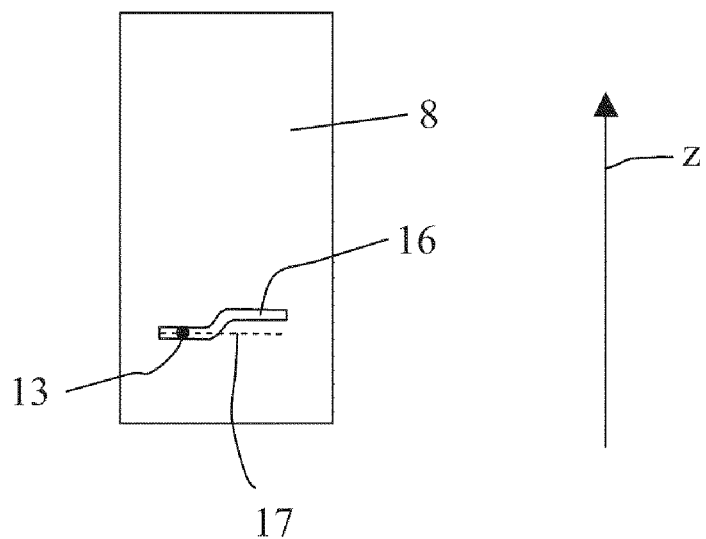
FIG. 7 shows parts of the die ejector.

The first drive mechanism 11 (FIG. 1) is a pneumatically movable cylinder for example which may assume a first lowered and a second lifted position. The first drive mechanism 11 can also be an electric drive whose z-position is adjustable in a program-controlled manner. The second drive mechanism 12 is a mechanism based on the principle of a cam disk. The second drive mechanism 12 comprises a motor 14 and a pin 13 which can be moved along a predetermined path 17 and which is moved by the motor 14 between two end positions back and forth. The predetermined path 17 is preferably a straight line or a circular path. The plates 8 each comprise a path-like opening 16 (FIG. 7) and the pin 13 is guided through all these openings. FIG. 7 shows a top view of one of the plates 8 with the path-like opening 16 and the pin 13 that is guided through the same. When pin 13 is moved along the path 17, which in this example is a horizontally extending straight line, from the left end of the path 17 to the right end of the path 17, the plate 8 is moved in the negative z-direction, namely on the short middle section of the opening 16 which extends in an oblique manner in relation to the lateral sections. Since pin 13 always assumes the same z-position in this embodiment, the plate 8 is lowered in the z-direction when the pin 13 passes through the middle oblique section. This middle section of the opening 16 is placed at a different location from plate 8 to plate 8, so that the plates 8 are lowered in a predetermined sequence in the z-direction, as desired. When the pin 13 is not moved on a straight line but on a circular path, the path-like openings 16 have a respectively different progression.

It is also possible to integrate the movement caused by the first drive mechanism 11 (FIG. 1) in the second drive mechanism 12, so that the first drive mechanism 11 can be omitted. In this case, the path-like openings 16 of the plates 8 are provided with an additional section which causes the simultaneous lifting of the plates 8 in the z-direction by a predetermined distance.

Figure 8:
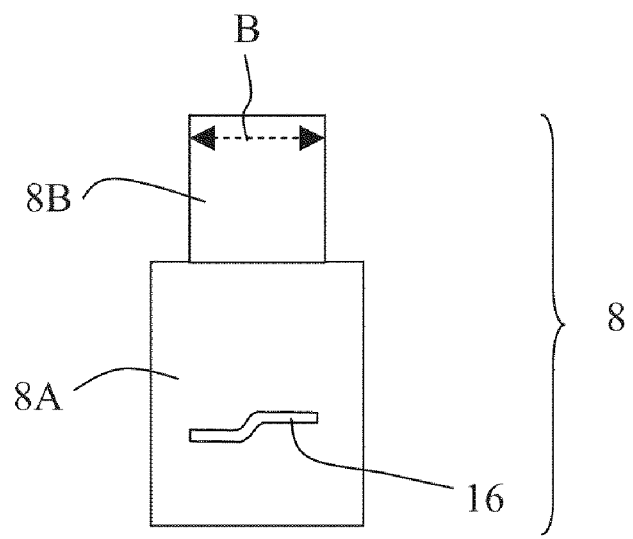
FIG. 8 shows a plate consisting of two parts.

In order to ensure that the die ejector 1 can be adjusted to semiconductor chips of different size, the plates 8 are preferably made of two parts, as shown in FIG. 8, namely with a bottom part 8A which contains the path-like opening 16 and an upper part 8B which can be inserted on the bottom part 8A. The bottom parts 8A of the plates 8 remain unchanged in the die ejector 1, whereas the number and width B of the upper parts 8B and the hole 6 in the cover plate 3 are adjusted to the dimensions of the semiconductor chip.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A die ejector, comprising
a chamber with a cover plate which can be subjected to a vacuum, the cover plate comprising a surface with a hole,
a plurality of plates arranged in the interior of the chamber, protruding into the first hole and displaceable in a direction extending perpendicular or in an oblique way in relation to the surface of the cover plate, and
drive means for displacing the plates, the drive means comprising a drive mechanism which comprises a motor and a pin,
the pin movable back and forth between two positions along a predetermined path by the motor,
each of the plates having a path-like opening and the pin being guided through the path-like opening of each of the plates, with the path-like opening being different from plate to plate in such a way that the plates are displaced in a predetermined sequence in the mentioned direction when the pin is moved along the path.

2. The die ejector according to claim 1, the drive means comprising a further drive mechanism with which the plates are jointly displaceable in the mentioned direction.

3. The die ejector according to claim 2, wherein the plates comprise a first part which contains the path-like opening, is arranged in the chamber and coupled to said drive mechanism, and a second part which can be inserted on the first part.

4. The die ejector according to claim 1, wherein the plates comprise a first part which contains the path-like opening, is arranged in the chamber and coupled to said drive mechanism, and a second part which can be inserted on the first part.

* * * * *